United States Patent
Carpentier et al.

(10) Patent No.: US 7,274,274 B2
(45) Date of Patent: Sep. 25, 2007

(54) INTEGRABLE ACOUSTIC RESONATOR AND METHOD FOR INTEGRATING SUCH RESONATOR

(75) Inventors: Jean-François Carpentier, Grenoble (FR); Cyrille Tilhac, Soudaine Lavinadiere (FR); Didier Belot, Rives (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 11/025,599

(22) Filed: Dec. 29, 2004

(65) Prior Publication Data

US 2005/0174199 A1    Aug. 11, 2005

(30) Foreign Application Priority Data

Dec. 29, 2003    (FR)    .................................. 03 15480

(51) Int. Cl.
*H03H 9/00* (2006.01)
*H03H 9/38* (2006.01)

(52) U.S. Cl. ..................................... 333/188; 333/187
(58) Field of Classification Search ................ 333/187, 333/188, 189, 193
See application file for complete search history.

(56) References Cited

U.S. PATENT DOCUMENTS

| | | | |
|---|---|---|---|
| 5,043,681 A | 8/1991 | Tanemura et al. | 331/107 A |
| 6,950,639 B2 | 9/2005 | Gogolla et al. | 455/196.1 |
| 7,030,718 B1 * | 4/2006 | Scherer | 333/188 |
| 2001/0028277 A1 | 10/2001 | Northam | 331/34 |
| 2004/0227578 A1 | 11/2004 | Hamalainen | |
| 2005/0266823 A1 | 12/2005 | Cathelin et al. | 455/344 |

FOREIGN PATENT DOCUMENTS

| | | |
|---|---|---|
| DE | 10234685 A1 | 2/2004 |
| FR | 2 455 816 | 11/1980 |
| GB | 615841 | 1/1949 |
| WO | WO 02/25813 A1 | 3/2002 |
| WO | 2004/066495 A1 | 8/2004 |

OTHER PUBLICATIONS

Akbari-Dilmaghani, R., et al., "A High Q RF CMOS Differential Active Inductor," in Proceedings of the IEEE Electronics, Circuits and Systems Int'l. Conference, Lisboa, Portugal, Sep. 7-10, 1998, pp. 157-160.

Koroglu, M., et al., "A 1.9Ghz Image-Reject Front-End with Automatic Tuning in a 0.15μm CMOS Technology," in Proceedings of the IEEE Int'l. Solid State Circuits Conference, San Francisco, CA, Feb. 9-13, 2003, pp. 1-10.

* cited by examiner

*Primary Examiner*—Dean Takaoka
(74) *Attorney, Agent, or Firm*—Lisa K. Jorgenson; Dennis M. de Guzman; Seed IP Law Group PLLC

(57) ABSTRACT

An acoustic resonator circuit to be integrated into a semiconductor product including: a resonator comprising first and second resonant frequencies; an inductive resistor tuned to said second resonant frequency so as to cancel the latter and to allow tuning of the resonator to said first resonant frequency; an tunable capacitive tuning element allowing to tune the resonator to said first frequency. A method is also provided for manufacturing an integrated circuit comprising an acoustic component allowing sufficient control of resonator characteristics.

24 Claims, 5 Drawing Sheets

INTEGRABLE ACOUSTIC RESONATOR AND METHOD FOR INTEGRATING SUCH RESONATOR

BACKGROUND OF THE INVENTION

1. Field of the Invention

The present disclosure generally relates to microelectronic circuits and more particularly but not exclusively to an acoustic resonator intended to be integrated into a semiconductor product.

2. Field of the Invention

Acoustic resonators are well-known components that have been the subject of many studies. They are typically used for filtering operations, in particular in radio frequency (RF) filtering.

Conventionally, one distinguishes between Surface Acoustic Resonator (SAW) and Bulk Acoustic Resonators (BAW). In SAWs, the acoustic resonator is located on the surface of a semiconductor product while, in RAWs, it lays inside a volume delimited between a lower electrode and a higher electrode so that the acoustic wave develops in this volume.

Acoustic resonators are frequently used in RF filtering. They are likely, however, to be useful in many other applications in the future but the principal obstacle to the use of acoustic resonators lies in the difficulty of integrating them into a semiconductor product.

Indeed, the characteristics of the components coming out at the end of production lines show great dispersions, and even BAW-type resonators that are yet the best ones suited for arrangement on a silicon substrate. Even with particularly ambitious and inevitably expensive specifications—for example, with a tolerance of about 1 percent for the dimensions of the resonator elements, dispersion on electric characteristics of the resonator cannot be eliminated.

Such a dispersion problem is typically settled by selectively selecting components so as to retain only those products from the production lines that comply with precise specifications.

This traditional approach cannot be chosen when aiming to integrate such an acoustic resonator on a substrate. Indeed, in this case, discarding a great number of manufactured products only because part of the product—which only accounts for a fraction of the added value of this product— does not show the characteristics specified in specifications, is quite out of the question.

This constitute a crippling obstacle to the direct integration of such acoustic components into an integrated circuit, this obstacle being likely to slow down the general use of acoustic resonators in RF applications and other ones too.

The following patents illustrate background art:

Work of reference "RF MEMS Circuit Design for Wireless Communications," Hector J De Los Santos, Artech House, ISBN 1-58033 329-9, 2002, p. 163 and following, comprise general information on BAW-type acoustic resonators. This work does not address the problem of BAW resonator integration into an integrated circuit.

The integration of such components into an integrated circuit has been considered theoretically. Document "FBAR Filters at GHz Frequencies" by C Vale, J Rosenbaum, S. Horwitz, S. Krishnasvamy and R. Moore, in Forty Fourth Annual Symposium One Frequency Control, IEEE International Frequency Control Symposium, 1990, considers using on a same substrate, FBAR-type components in combination with passive elements in order to make filtering circuits. This document does not address the problem of the integration of these components into a semiconductor product; moreover, it does not describe how to increase the precision of the manufacturing method to allow such integration.

U.S. Pat. No. 5,446,306 entitled "Thin Film Voltage-Tuned Semiconductor Bulk Acoustic Resonator (SBAR)" describes tuning of a BAW resonator by means of a d.c. voltage, but does not actually describe how to proceed. Moreover, it completely ignores the problem of resonator integration into semiconductor products and, especially, how to adjust the frequency of the resonator in practical terms.

U.S. Pat. No. 5,714,917 entitled "Device Incorporating Has Tunable Thin Film Bulk Acoustic Resonator for Performing Amplitude and Phase Modulation" describes a BAW-type resonator which is made tunable in order to carry out phase and amplitude modulation. This document by no means describes how to adjust resonator frequencies nor does it show how to facilitate its integration into an integrated circuit while getting around the limitations inherent in the manufacturing method.

As can be noted, background art documents address neither the problem of the integration of acoustic resonators into a semiconductor product, nor how to remedy the manufacturing method's shortcomings.

This problem is however essential for whoever seriously aims at developing and using such components on a large-scale in future semiconductor products.

BRIEF SUMMARY OF THE INVENTION

An embodiment of the present invention provides a new acoustic component comprising a resonator and allows an easy integration into a semiconductor product.

Another embodiment of this invention comprises providing a circuit for automatically adjusting the characteristics of an acoustic resonator in order to ensure it complies with given specifications.

A third embodiment of this invention provides a method for manufacturing a semiconductor product comprising a resonator incorporated into a substrate.

An embodiment comprises an acoustic resonator circuit meant to be integrated into a semiconductor product and comprising a resonator having a first and a second resonant frequency. The circuit comprises a capacitive tuning element for tuning the resonator to the first frequency—chosen as operational frequency—while an inductive resistor is tuned to the second resonant frequency in order to strengthen the tuning effect of said capacitive tuning element.

In a particular embodiment, the inductive resistor is connected in series with the resonator and is set to the second frequency corresponding to the resonator's series resonance. The capacitive tuning element is then connected in parallel for tuning the parallel frequency.

Alternatively, the inductive resistor is connected in parallel with the resonator and is set to the second frequency fixed by the parallel capacity of the resonator. The capacitive tuning element is then connected in series for tuning the series frequency.

Thus, in both cases, the effect of the capacitive tuning element is strengthened by means of a judiciously selected inductive resistor.

The operation frequency of the resonator can thus be easily modified to compensate for the inaccuracy of the manufacturing method.

In one embodiment, the capacitive tuning element is composed of variable capacitors that are easy to integrate, such as, for example, a set of scale-structured switches and capacitors.

In one embodiment, the capacitive tuning element is composed of a voltage-controlled capacitive element making it possible to vary the value of the capacitor that is connected either in series or in parallel with the resonator.

In one embodiment, the control circuit of the capacitive element comprises a reference resonator for measuring the characteristics of the manufacturing method, said measuring circuit generating the control voltage of the capacitive tuning element.

Automatic adjustment of the resonator's operational frequency is thus obtained, in spite of the limitations of the manufacturing method.

One embodiment of the invention also provides a method for manufacturing an integrated circuit comprising the following:

integrating an acoustic resonator into a semiconductor product substrate;
inserting an inductive resistor cooperating with said resonator so as to cancel said second resonant frequency;
inserting a tunable capacitive tuning element in order to compensate for the lack of precision in said first resonant frequency of said resonator;
measuring the characteristics of said resonator; and
in response to said measurement, controlling said capacitive tuning element of the tuning element in order to set the resulting resonance of said acoustic component to a value complying with the manufacture specifications for said integrated circuit.

BRIEF DESCRIPTION OF THE SEVERAL VIEWS OF THE DRAWINGS

Other features of the invention will best be understood by reference to the following detailed description of illustrative and non-restrictive embodiments when read in conjunction with the accompanying drawings, wherein.

DETAILED DESCRIPTION

Embodiments of an integrable acoustic resonator and method for integrating such resonator are described herein. In the following description, numerous specific details are given to provide a thorough understanding of embodiments. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Acoustic resonators of the BAW type are suited for integration because of the highest degree of accuracy that can be obtained for layer thickness in the vertical direction. Clearly, here is shown at least one particular embodiment, and people qualified in the art will be able to adapt the invention to all other types of resonators, in particular resonators of the SAW type.

Figure 1A:
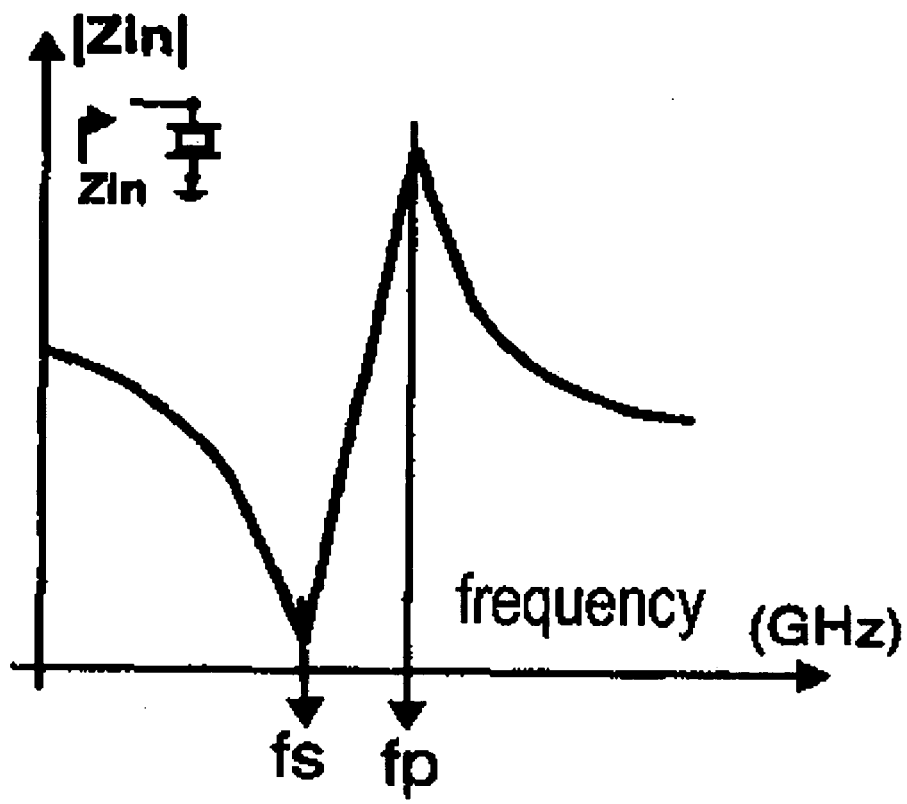
FIG. 1a illustrates an impedance curve of a BAW-type acoustic resonator.

Acoustic resonators have two very close resonant frequencies, $f_s$ (series) and $f_p$ (parallel) respectively, as illustrated in FIG. 1a. When referring to an equivalent electric diagram shown in FIG. 1b, that amounts to considering two LC-type resonator circuits, series and parallel respectively.

Traditionally, resonant circuits are simultaneously used for filtering as it is the case in the previously mentioned document "RF MEMS Circuit Design for Wireless Communications," Hector J De Los Santos.

On the contrary, in the circuit according to one embodiment of the invention, one resonant effect is cancelled by means of a judiciously calibrated inductive resistor—series or parallel. It is then possible to act on the other resonant frequency by means of a tuning element.

Figure 2A:
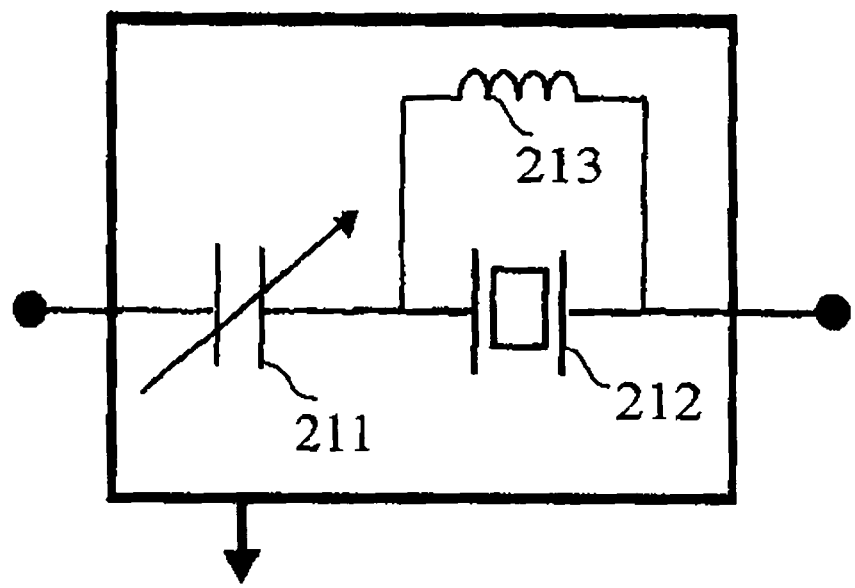
FIGS. 2a and 2b illustrate two embodiments of a circuit according to the invention.

FIG. 2a illustrates a first embodiment of the invention in which the series resonance the resonator is acted upon. To this end, a resonator 212 and an inductive resistor 213 that is calibrated to start resonating with the parallel capacity of this same resonator, close to frequency $f_p$, are assembled in parallel connection. It is then possible to properly work on the series resonance and to compensate for its lack of precision (i.e., series frequency $f_s$) by means of a capacitive tuning element 211.

Figure 1B:
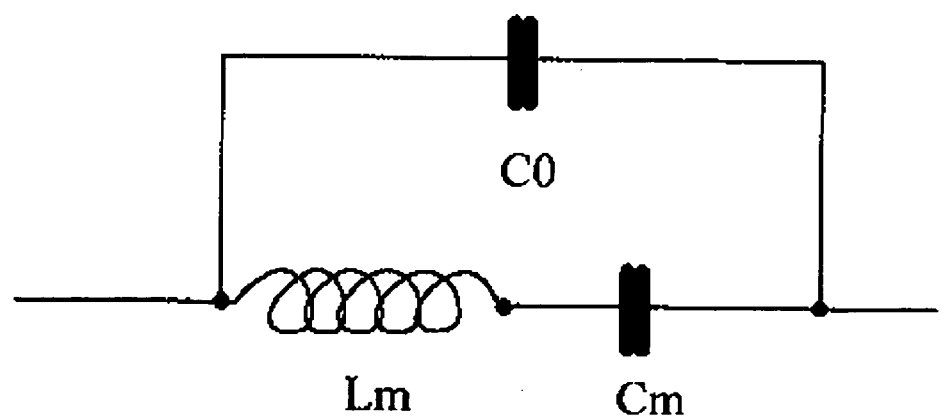
FIGS. 1b and 1c show the equivalent electric diagram of a BAW-type acoustic resonator, respectively in series and parallel.

Referring to FIG. 1b, the inductance of inductive element 213 is given by:

$$L1/(4\pi^2) \times 1/(C_0 \times f_p^2)$$

Figure 1C:
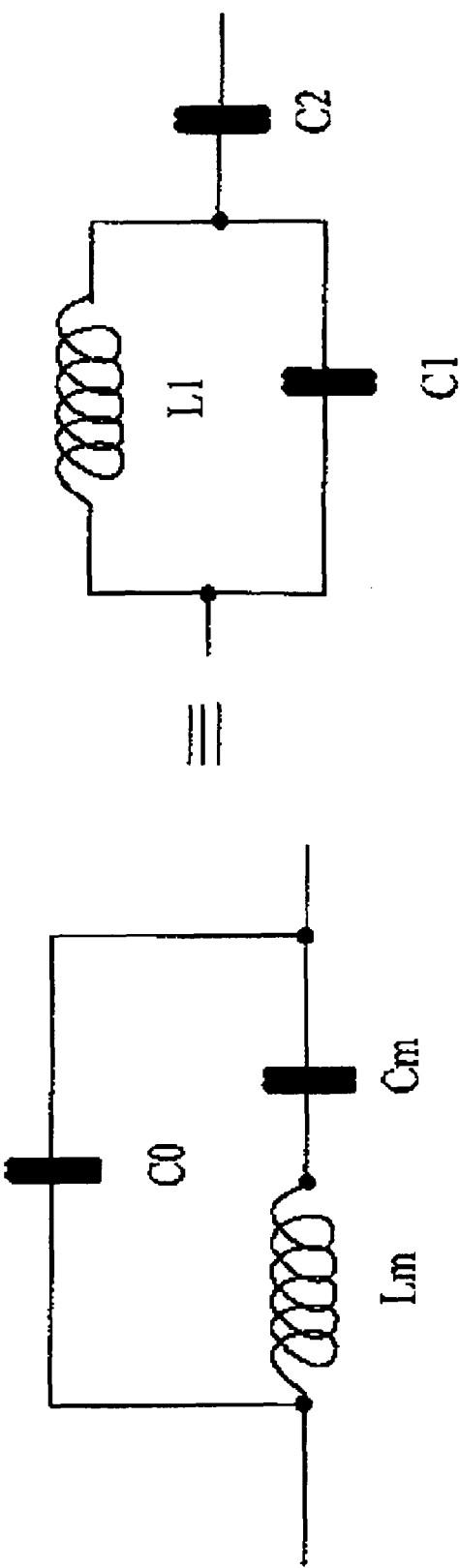
Figure 2B:
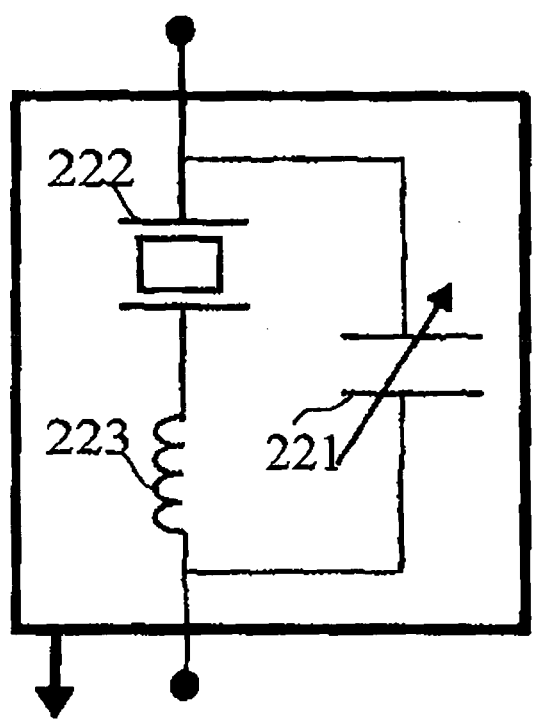

FIG. 2b corresponds to a second embodiment in which the parallel resonance of a resonator 222 is now acted upon. To this end, this time an inductive resistor 223 that is calibrated to start resonating with the equivalent series capacity (C2) close to frequency fs of the resonator of FIG. 1c is connected in series with resonator 222. Then, a capacitive tuning element (221) is connected in parallel with both series elements, to interact with the parallel resonance of resonator 222 and to regulate frequency $f_p$.

Thus, one manages to adjust the operational frequency—within a broad range—by means of tuning element, 211 or 221 according to the case. There is a true cooperation between inductive resistor 213 (or 223) which interacts on the first of the two resonant frequencies so as to reinforce the capacitive tuning carried out by tuning element 211 (or 221).

An element for tuning the operation frequency, series or parallel according to the case, is thus obtained which makes it possible to compensate for the lack of precision of the manufacturing method. This new approach advantageously contrasts with the traditional technique, such as described in document "RF MEMS Circuit Design for Wireless Communications," Hector J De Los Santos, previously mentioned, which is based on both resonant frequencies for filtering. As can be seen, the traditional approach requires accuracy on both frequencies, which raises more clearly the problem of circuit integration into a semiconductor product.

With one embodiment of the invention, on the other hand, it is possible to finely regulate the operational resonant frequency and, thus, to avoid having to throw away those manufactured goods whose resonator does not show the desired characteristics from the start.

With traditional tolerances in industrial microelectronics manufacturing methods for depositing piezoelectric layers—i.e., 1 or 2 percent for layer thickness physical dimensions—the dispersion of resonator characteristics can be compensated for by means of a capacitive tuning element varying in a 1-3 ratio.

The new acoustic component is very easy to integrate into a more complex microelectronic unit, without having to discard a great number of manufactured circuits since it is possible to compensate, with accuracy, for any tolerance defect in a dimension of an element of the resonator.

Figure 3:
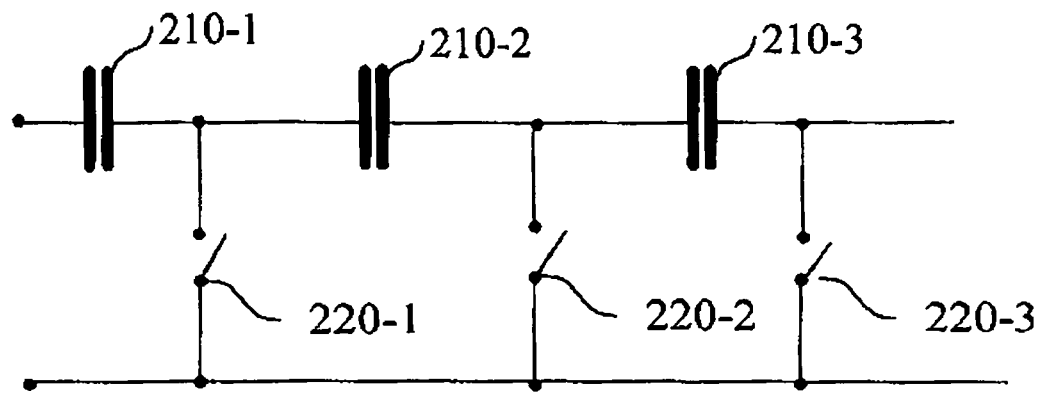
FIG. 3 illustrates a first embodiment of a capacitive tuning element.

Capacitive tuning element 211 (or 221) can be realized in multiple ways. A sequential implementation can be used, namely a cascade of quadripoles whose basic element is a quadripole composed of a capacitor 210-$i$ connected in series (only capacitors 210-1, 210-2 and 210-3 are shown in FIG. 3) and a switch 220-$i$ connected in parallel. The assembly forms a scale having a variable capacity adjustable by means of control (not shown) of the various switches 220-$i$.

Figure 4:
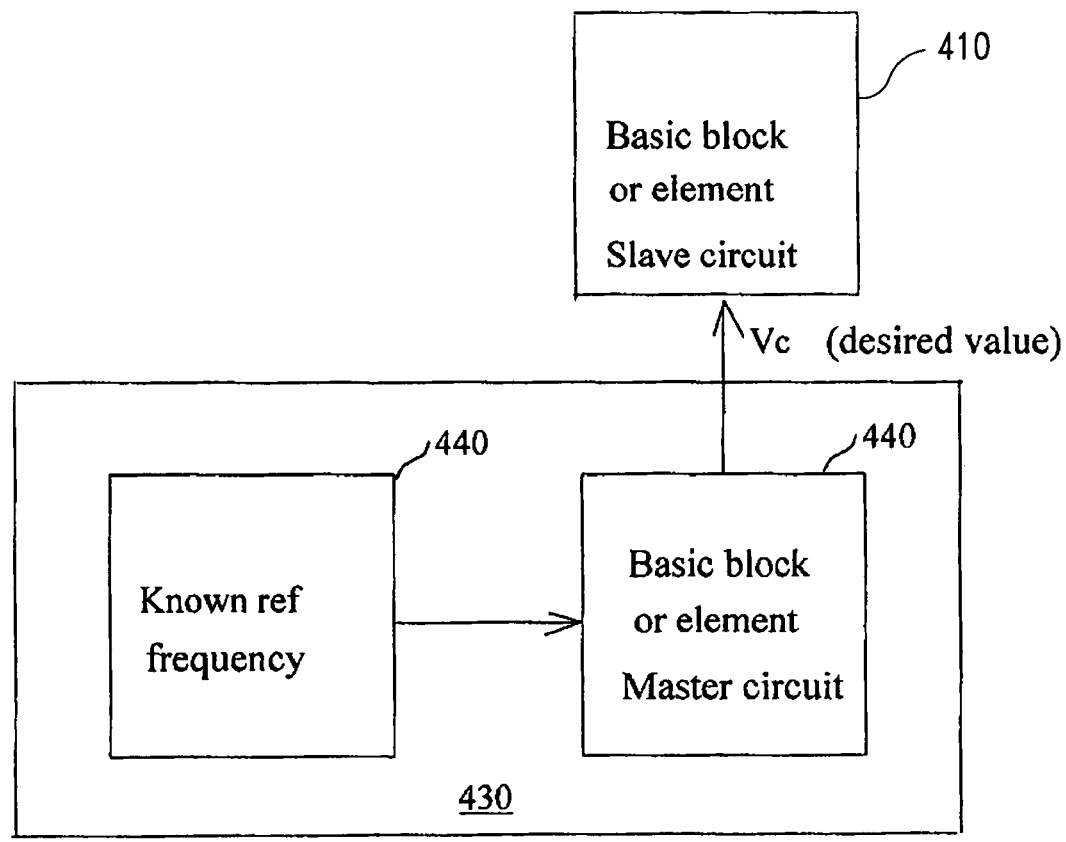
FIG. 4 illustrates a second embodiment of a capacitive tuning element, which element is voltage-controlled.

FIG. 4 (circuit 430) shows another embodiment of capacitive tuning element 211 or 221 (for example), which is included in a circuit constituting a basic element used as reference. This basic element results from the same manufacturing method as the other elements and, consequently, shows characteristics similar to those of the other resonators to be adjusted.

A circuit 430 uses a known reference frequency and a measuring circuit 440 measuring BAW resonator characteristics in order to generate an representative electrical signal—for example a voltage Vc as desired voltage—that controls capacitive element 410.

Figure 5:
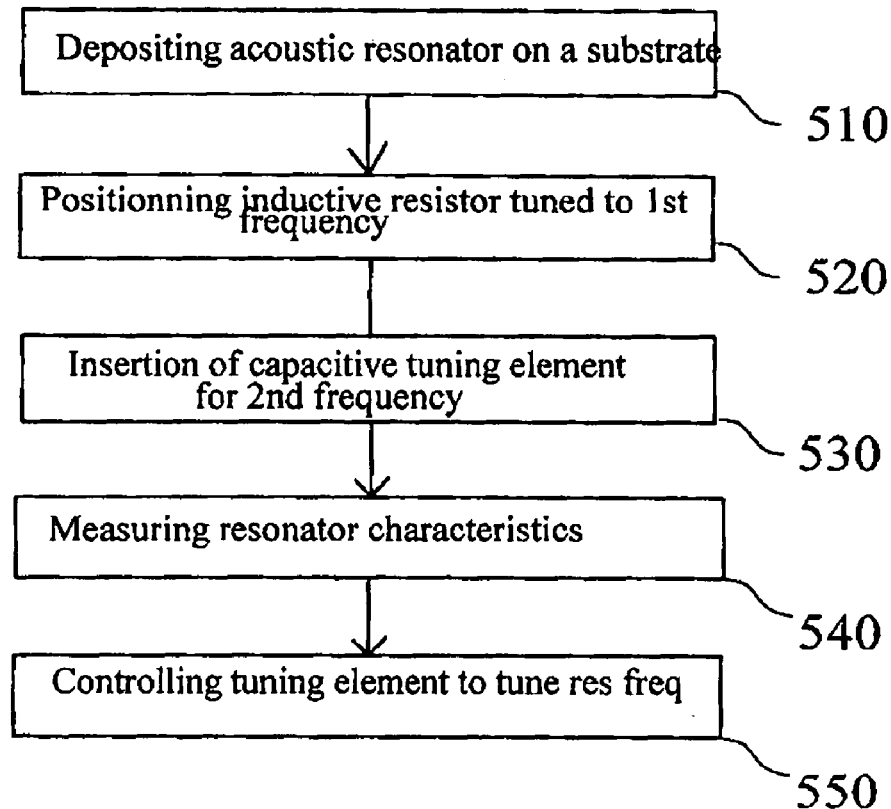
FIG. 5 illustrates a method for manufacturing an integrated circuit comprising an acoustic resonator according to an embodiment of the present invention.

One embodiment of the invention also provides a new method for manufacturing an integrated circuit comprising a resonator. To this end, as can be seen in FIG. 5, the process comprises the following:

In 510, an acoustic resonator, such as a BAW-type resonator, which comprises first and second resonant frequencies, is deposited on a substrate—in particular a silicon substrate.

In 520, an inductive resistor tuned to said first resonant frequency is positioned on the substrate in order to reinforce the tuning effectiveness of the capacitive tuning element.

520 is then completed by 530 that comprises the insertion of a capacitive tuning element cooperating with the resonator so as to tune the second resonant frequency (series or parallel).

In 540, the resonator characteristics are measured and, in 550, a control voltage is generated in response to said measure, in order to interact with the second resonant frequency of the resonator.

An integrated circuit equipped with an acoustic resonator component whose resonant frequency can be easily regulated is thus manufactured, in a simple and extremely advantageous way.

The use of acoustic resonators can now be extended to microelectronics in general.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

The above description of illustrated embodiments, including what is described in the Abstract, is not intended to be exhaustive or to limit the invention to the precise forms disclosed. While specific embodiments and examples are described herein for illustrative purposes, various equivalent modifications are possible within the scope of the invention and can be made without deviating from the spirit and scope of the invention.

These and other modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An acoustic resonator circuit to be integrated into a semiconductor product including a resonator having a first and a second resonant frequency, the circuit comprising:
    an inductive resistor to cancel said second resonant frequency; and
    a capacitive tuning element to tune said resonator to said first frequency; wherein
    the tuning of said resonator to said first frequency being reinforced by an effect of said inductive resistor, wherein said resonator is a bulk acoustic wave (BAW)-type resonator that is integrated in said semiconductor product.

2. A circuit according to claim 1 wherein said inductive resistor is connected in series and is set to a series resonant frequency of said resonator in order to reinforce the tuning effect on a parallel resonant frequency.

3. A circuit according to claim 1 wherein said inductive resistor is connected in parallel and is set to a parallel resonant frequency of said resonator in order to reinforce the tuning effect on a series resonant frequency.

4. A circuit according to claim 1 wherein said capacitive tuning element comprises a cascade of capacitors and switches making it possible to tune the resonator to said first resonant frequency.

5. A circuit according to claim 1 wherein said capacitive tuning element is voltage-controlled to set said first resonant frequency.

6. A circuit according to claim 5, further comprising a measuring element intended to cooperate with said capacitive tuning element, said measuring element including a reference resonator for measuring characteristics of a manufacturing method, said measuring element generating a voltage controlling the capacitive tuning element.

7. A method for manufacturing an integrated circuit including an acoustic component based on an acoustic resonator having first and second resonant frequencies, said method comprising:
    integrating an acoustic resonator into a semiconductor product substrate, said resonator being a bulk acoustic wave (BAW)-type resonator;
    inserting an inductive resistor cooperating with said resonator so as to cancel said second resonant frequency;
    inserting a tunable capacitive tuning element in order to compensate for a lack of accuracy in said first resonant frequency of said resonator;
    measuring characteristics of said resonator using a reference element; and in response to said measurement, controlling said capacitive tuning element in order to set a resulting resonance of said acoustic component to a value complying with manufacture specifications for said integrated circuit.

8. A manufacturing method according to claim 7 wherein said capacitive tuning element comprises a cascade of capacitors and switches making it possible to tune the resonator to said first resonant frequency.

9. A manufacturing method according to claim 7 wherein said capacitive tuning element is voltage-controlled, which makes it possible to regulate said first resonant frequency.

10. An apparatus including a resonator having first and second resonant frequencies, the apparatus comprising:
   an inductive element coupled to the resonator to cancel the second resonant frequency; and
   a capacitive element coupled to the resonator to tune the resonator to the first resonant frequency, the inductive element being coupled to strengthen a tuning effect by the capacitive element to the first resonant frequency,
   wherein said resonator is a bulk acoustic wave (BAW)-type resonator that is integrated in a semiconductor product.

11. The apparatus of claim 10 wherein the first resonant frequency comprises a parallel resonant frequency and the second resonant frequency comprises a series resonant frequency, the inductive element being coupled in series with the resonator to cancel the series resonant frequency, the capacitive element being coupled in parallel to the resonator to tune the resonator to the parallel resonant frequency.

12. The apparatus of claim 10 wherein the first resonant frequency comprises a series resonant frequency and the second resonant frequency comprises a parallel resonant frequency, the inductive element being coupled in parallel with the resonator to cancel the parallel resonant frequency, the capacitive element being coupled in series to the resonator to tune the resonator to the series resonant frequency.

13. The apparatus of claim 10 wherein the capacitive element includes:
   a plurality of cascade-coupled capacitors; and
   a plurality of controllable switches respectively coupled to the plurality of capacitors to allow individual selection of the capacitors to change a capacitance of the capacitive element.

14. The apparatus of claim 10 wherein the capacitive element can be voltage controlled based on a reference frequency.

15. A method usable with a resonator having first and second resonant frequencies, the method comprising:
   using an inductive element to cancel the second resonant frequency;
   using a capacitive element to tune the resonator to the first resonant frequency; and
   using the inductive element to strengthen a tuning effect by the capacitive element to the first resonant frequency,
   wherein said resonator is a bulk acoustic wave (BAW)-type resonator that is integrated in a semiconductor product.

16. The method of claim 15 wherein the first resonant frequency comprises a parallel resonant frequency and the second resonant frequency comprises a series resonant frequency, wherein the inductive element cancels the series resonant frequency and the capacitive element tunes the resonator to the parallel resonant frequency.

17. The method of claim 15 wherein the first resonant frequency comprises a series resonant frequency and the second resonant frequency comprises a parallel resonant frequency, wherein the inductive element cancels the parallel resonant frequency and the capacitive element tunes the resonator to the series resonant frequency.

18. The method of claim 15 wherein using the capacitive element to tune the resonator to the first resonant frequency includes selectively connecting series-coupled capacitors to change a capacitance of the capacitive element.

19. The method of claim 15, further comprising voltage-controlling the capacitive element based on a reference frequency.

20. A system including a resonator having first and second resonant frequencies, the system comprising:
   means for using an inductive element to cancel the second resonant frequency;
   means for using a capacitive element to tune the resonator to the first resonant frequency; and
   means for using the inductive element to strengthen a tuning effect by the capacitive element to the first resonant frequency,
   wherein said resonator is a bulk acoustic wave (BAW)-type resonator that is integrated in a semiconductor product.

21. The system of claim 20 wherein the first resonant frequency comprises a parallel resonant frequency and the second resonant frequency comprises a series resonant frequency, the inductive element being coupled in series with the resonator to cancel the series resonant frequency, the capacitive element being coupled in parallel to the resonator to tune the resonator to the parallel resonant frequency.

22. The system of claim 20 wherein the first resonant frequency comprises a parallel resonant frequency and the second resonant frequency comprises a series resonant frequency, the inductive element being coupled in parallel with the resonator to cancel the parallel resonant frequency, the capacitive element being coupled in series to the resonator to tune the resonator to the series resonant frequency.

23. The system of claim 20, further comprising means for voltage-controlling the capacitive element based on a reference frequency.

24. The system of claim 20, further comprising means for measuring a manufacturing characteristic of the resonator and for using the measurement to control the capacitive element to set a resulting resonance of the resonator to a value substantially complying with manufacture specifications.

* * * * *